United States Patent
Ford et al.

(10) Patent No.: US 7,788,417 B2
(45) Date of Patent: Aug. 31, 2010

(54) TARGET DEVICE PROGRAMMER

(75) Inventors: Simon Andrew Ford, Cambridge (GB); Christopher James Styles, Cambridge (GB)

(73) Assignee: ARM Limited, Cambridge (GB)

( * ) Notice: Subject to any disclaimer, the term of this patent is extended or adjusted under 35 U.S.C. 154(b) by 456 days.

(21) Appl. No.: 11/822,149

(22) Filed: Jul. 2, 2007

(65) Prior Publication Data

US 2008/0195856 A1    Aug. 14, 2008

(30) Foreign Application Priority Data

Jun. 30, 2006   (GB)   ................................. 0613138.7

(51) Int. Cl.
*G06F 3/00* (2006.01)
*G06F 13/00* (2006.01)

(52) U.S. Cl. ............................... 710/8; 710/15; 710/62; 710/72; 710/104

(58) Field of Classification Search ............... 710/8–10, 710/15, 62–64, 72–74, 104–106; 711/27–31, 711/37–43, 102, 154; 713/1–2, 180
See application file for complete search history.

(56) References Cited

U.S. PATENT DOCUMENTS

| | | | |
|---|---|---|---|
| 6,249,881 B1 * | 6/2001 | Porten et al. ................... 714/38 |
| 6,308,311 B1 | 10/2001 | Carmichael et al. |
| 6,754,725 B1 | 6/2004 | Wright et al. |
| 6,813,669 B1 | 11/2004 | Cato et al. |
| 6,973,591 B2 * | 12/2005 | Debling ........................ 714/30 |
| 7,073,013 B2 * | 7/2006 | Lasser ......................... 711/102 |
| 7,401,257 B2 * | 7/2008 | Usui ............................ 714/27 |
| 7,505,331 B1 * | 3/2009 | Camarota .............. 365/189.08 |
| 2003/0154429 A1 * | 8/2003 | Chen ............................ 714/43 |
| 2003/0233221 A1 | 12/2003 | O'Brien et al. |
| 2004/0267480 A1 | 12/2004 | Day |
| 2005/0005076 A1 * | 1/2005 | Lasser ......................... 711/154 |
| 2006/0023253 A1 | 2/2006 | Byun et al. |
| 2006/0047465 A1 | 3/2006 | Ousley et al. |
| 2007/0006035 A1 * | 1/2007 | Usui ............................ 714/38 |
| 2008/0222404 A1 * | 9/2008 | Jiang et al. ..................... 713/1 |

FOREIGN PATENT DOCUMENTS

| | | |
|---|---|---|
| EP | 1 205 845 | 5/2002 |
| JP | 2002-342085 | 11/2002 |
| KR | 2006-0034772 | 4/2006 |
| WO | WO 00/17749 | 3/2000 |
| WO | WO 2005/022390 A1 | 3/2005 |

OTHER PUBLICATIONS

Archos English Language User Manual, http://www.archos.com/support/download/manuals/EN_PMA400_Manual_V21.pdf, 2005, pp. 1-78.

* cited by examiner

*Primary Examiner*—Christopher B Shin
(74) *Attorney, Agent, or Firm*—Nixon & Vanderhye P.C.

(57) ABSTRACT

A programmer 10 for a target device 16 is provided with a mass storage interface 12 for connecting to a host 2 so as to appear as a mass storage device to the host 2. A target programmer 18 is responsive to an image transferred from the host 2 to the programmer 10 to apply that image to the target device 16.

33 Claims, 5 Drawing Sheets

TARGET DEVICE PROGRAMMER

BACKGROUND OF THE INVENTION

1. Field of the Invention

This invention relates to the field of data processing systems. More particularly, this invention relates to a programmer for programming a target device with a program from a host.

2. Description of the Prior Art

It is known to provide programmers for target devices for the purpose of loading programs to those target devices. Typical examples are programmers for loading programs onto development boards. A typical arrangement would be a general purpose computer, such as a PC, connected via a PC supported interface to a specialised programmer interface unit which is in turn connected to the target device, such as via a JTAG connection. Such an arrangement allows complex aspects of the programming control to be handled by the PC under software control which provides a cost efficient and flexible way of dealing with these issues. Furthermore, the specialised programmer interface allows considerable flexibility in the way in which the host (target) may be controlled. Whilst these systems work well in a commercial development environment, they are not well suited to more widespread use in less formal environments, such as educational or hobby environments.

A disadvantage with the above described systems is that special purpose software including appropriate driver software for the programmer, has to be loaded on to the PC. This can increase costs and poses security policy problems, e.g. within educational environments where the loading of additional software and drivers is at least tightly controlled and often prohibited.

SUMMARY OF THE INVENTION

Viewed from one aspect the present invention provides a programmer for programming a target device with an image from a host, said programmer comprising:

a mass storage interface;

processing logic coupled to said mass storage interface to generate signals so as to appear as a mass storage device to said host such that a file containing said image from said host can be transferred to said programmer as if said programmer were said mass storage device; and a target programmer responsive to said image:

(i) to generate programming control signals applied to said target device;

(ii) to extract said image from said file; and (iii) to apply said image to said target device under control of said programming control signals.

The present technique recognises the problems associated with utilising the conventional approach in some environments and provides the solution of forming the programmer such that it appears to the host as a mass storage device. Whilst this detracts from the ability of the PC to control complex aspects of the programming and requires a more capable (intelligent) programmer as well as restricting the flexibility in how the host can be controlled, it does provide surprising compensating advantages. Most host computers already have the necessary hardware, interfaces and software (such as appropriate generic device drivers) to deal with mass storage devices as these are routinely connected to such computers. By making the programmer appear as a mass storage device to the host, it is able to be connected in a manner which avoids, or at least significantly reduces, the need to load additional software, drivers and the like. Furthermore, having the programmer appear as a mass storage device is well suited to the role of the programmer as transferring the image to be applied to the target device can be considered as a type of file transfer operation which maps readily to the appearance of the programmer to the host as a storage device. The image may be applied automatically once transferred to the programmer or may require a further input to trigger application. The mass storage interface may be less able than a bespoke programming interface to supply appropriate control signals to the target device (and require these to be generated on-board the programmer) but the advantages of the generic nature of the mass storage interface more than compensate for this disadvantage.

The present technique can be applied to a variety of target devices, such as programmable devices where the image is a program to be executed and field programmable grate array (FPGA) devices where the image is a configuration file for configuring the FPGA.

Whilst it will be appreciated that the image transferred from the host device could be a fully formed executable file suitable for direct use by the target device, in at least some embodiments the programmer can operate to process the received image before it is applied to the target device, such as by removing symbol tables, or other unnecessary portions, adding addition material, unzipping a compressed file, etc. The data received as a stream at the mass storage interface can be converted to a stream of data to be supplied to the target device to apply the image thereto.

The target device can take a variety of forms, such as a DSP, an ASIC, or any other device requiring programming or configuration, but will typically comprise a programmable processor core, which may be provided separately from the processing logic and the target programmer. The target device may also be provided on a separate development board and interfaced to the programmer via a communication mechanism, such as a JTAG interface.

Another class of embodiments, which is particularly well suited to low cost implementations, is one in which one or more of the processing logic and the target programmer includes a programmable processor core and that programmable processor core is reused as the target device.

Whilst it will be appreciated that the host could have a variety of different forms in the general application of the present technique, particularly preferred forms are when the host is a personal computer having a generic mass storage device driver for communicating with the programmer. This is conveniently provided as part of a USB mass storage interface with the programmer serving as a USB slave device as the support for such is commonly built in to many systems.

The present technique could also be used in systems in which the processing logic generates signals so as to appear as one or more other USB end point devices, either separately or concurrently. Examples of such devices are a USB custom device and a USB communications class device and an endpoint compatible with a custom programmer protocol In the context of the programmer acting as a mass storage device, it may also be necessary to pass control commands to the programmer and the mass storage device interface can also serve this function. In preferred embodiments, "virtual" files can be presented by the programmer to the host, which can be used by the host to interface with programmer/target using standard file access commands, e.g. can read from files to get information (e.g. read a status word), or write to files to represent commands (e.g. reset the target). It can be both what is written and/or what file is written to which is portraying the information, i.e. the file access operations mapped to predetermined actions can take a wide variety of different forms. As examples, reading a particular file which appears to be stored on the mass storage device representation can trigger the program downloaded to be executed or FPGA configuration data to be applied, the system to be reset or some other predetermined operation.

The mass storage device metaphor provided by the processing logic and the programmer may also be utilised to allow the target device to provide access by the host to a file generated by the target device, e.g. the target device could write result data to a location within the mass storage device which could then be read by the host. The reverse channel can also be used to provide a file of data characterising one or more of the programmer and the target device. The programmer can also act as a semi-host in which it responds to file access requests from the target device and makes these files available to the host.

The utility of the programmer is enhanced in systems in which the host is coupled via an internet connection to a web-based compiler for compiling source code to generate the program code to be applied to the target device or a web-based synthesis tool for synthesising a high level design language (HDL) description of a device to a configuration file for an FPGA to act as said device. By providing a web-based compiler this further avoids the need to install special purpose software upon the host easing the barriers which might otherwise prevent certain users being able to program target devices. The web-based tools can also be responsive to the uploaded configuration specifying files.

Viewed from another aspect the present invention provides a method of programming a target device with an image from a host, said method comprising the steps of:

generating signals at a mass storage interface of a programmer so that said programmer appears as a mass storage device to said host;

saving a file containing said image from said host to said programmer as if said programmer were said mass storage device; and in response to said image:

(i) generating programming control signals applied to said target device;

(ii) extracting said image from said file; and (iii) applying said image to said target device under control of said programming control signals.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
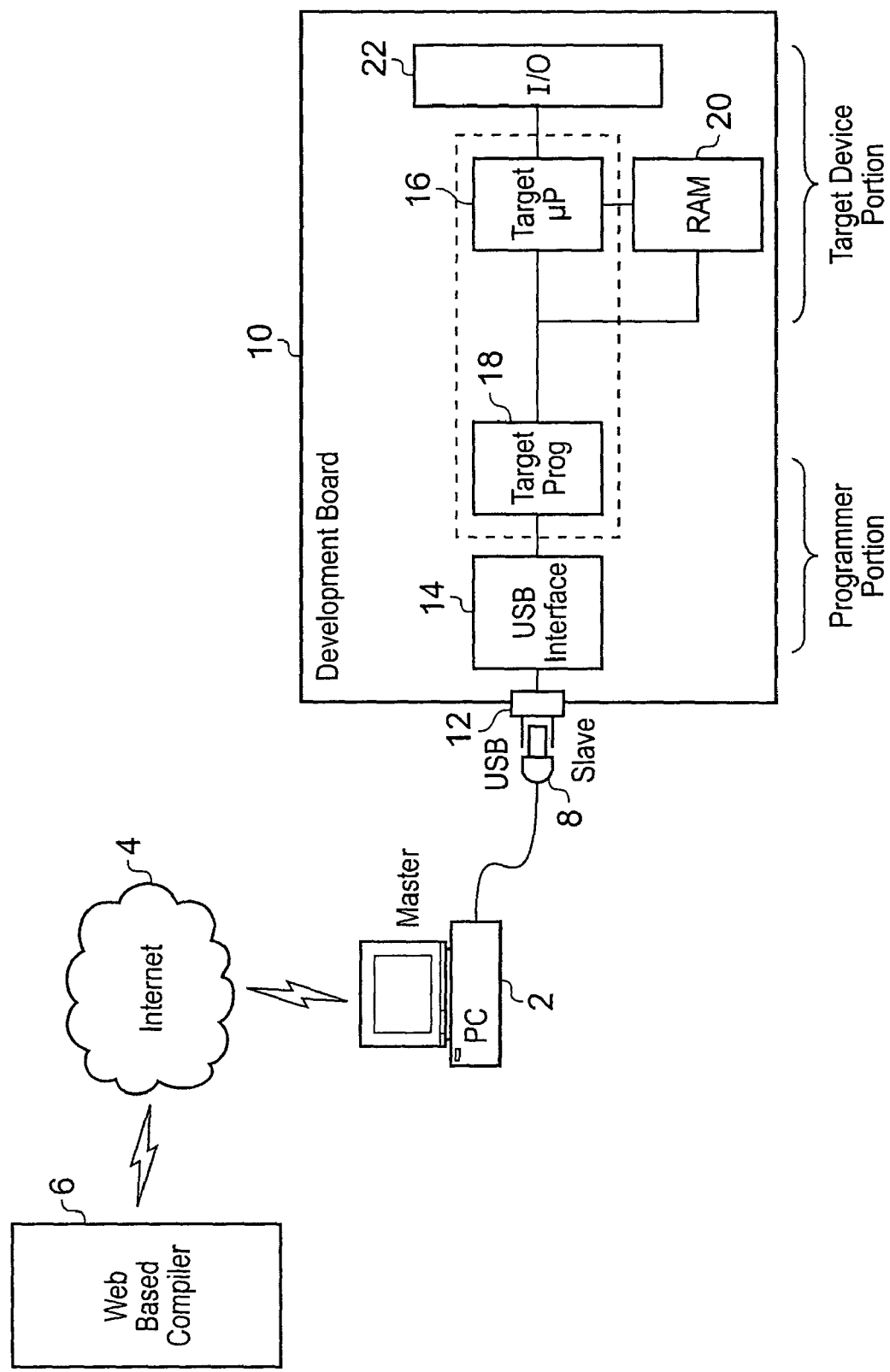
FIG. 1 schematically illustrates a first example embodiment of a system for programming a target device.

FIG. 1 shows a host device in the form of a personal computer 2 connected via an internet connection 4 to a web-based compiler 6. The personal computer 2 is also connected via a USB connection 8 to a development board 10.

The development board 10 includes a USB connector 12, which serves as at least part of a mass storage interface. Processing logic 14 on the development board 10 serves as a USB interface circuit and generates signals so as to make the development board 10 appear to be a mass storage device as viewed by the personal computer 2.

The personal computer 2 uses its generic mass storage device drivers, which are typically provided as standard within the operating system (e.g. Windows XP) of such personal computers 2, to connect to the development board 10. The USB interface 14 can be configured in a variety of ways, but would typically appear to provide a drive containing one or more predetermined folders into which the personal computer 2 can store files and from which the personal computer 2 can read files (such as log or result files written by a target processor 16).

The development board 10 has a programmer portion provided by the USB interface 14 and a target programmer 18. The target programmer 18 is responsive to a file transferred from the personal computer 2 to the development board 10 to extract the image from that file (e.g. stripping out unwanted file storage format sections), generate control signals to be applied to the target device to place it in a state to accept the image and then to apply the image so as to program the target device in the form of the target processor 16. The target programmer 18 processes the program received from the host 2 before it is applied to the target processor 16, such as, for example, stripping off unnecessary header information, unzipping the file or processing it in some other way. The target processor 16 could be replaced with an FPGA requiring configuration with a configuration file rather than programming with an executable file.

It will be appreciated that whilst in FIG. 1, and elsewhere in this description, the USB interface 14 and the target programmer 18 are illustrated as separate entities, these could in practice be formed by a single piece of logic, possibly combined with the target processor 16 (or FPGA). The illustration of FIG. 1 shows these elements separately merely to highlight the different portions of the functionality provided rather than to indicate that these elements must necessarily be provided as separate physical entities.

As mentioned, the target processor 16 may be a general purpose processor, such as an ARM processor, and can be separately provided as illustrated, or may be provided in the form of a single general purpose processor which also performs the roles of the target programmer 18 and/or the USB interface 14 when appropriately programmed and operating in the correct mode.

It will be seen that the development board 10 also includes a target device portion comprising the target processor 16, an associated memory 20 and some general purpose input/output circuits 22. This generic target device portion can take a variety of forms and will normally be chosen to provide flexibility to as to allow the development board 10 to be used for a variety of purposes. The input/output circuitry 20 will be particularly useful for interfacing the development board to other systems, such as using the development board to provide control functions in a prototype device.

Figure 2:
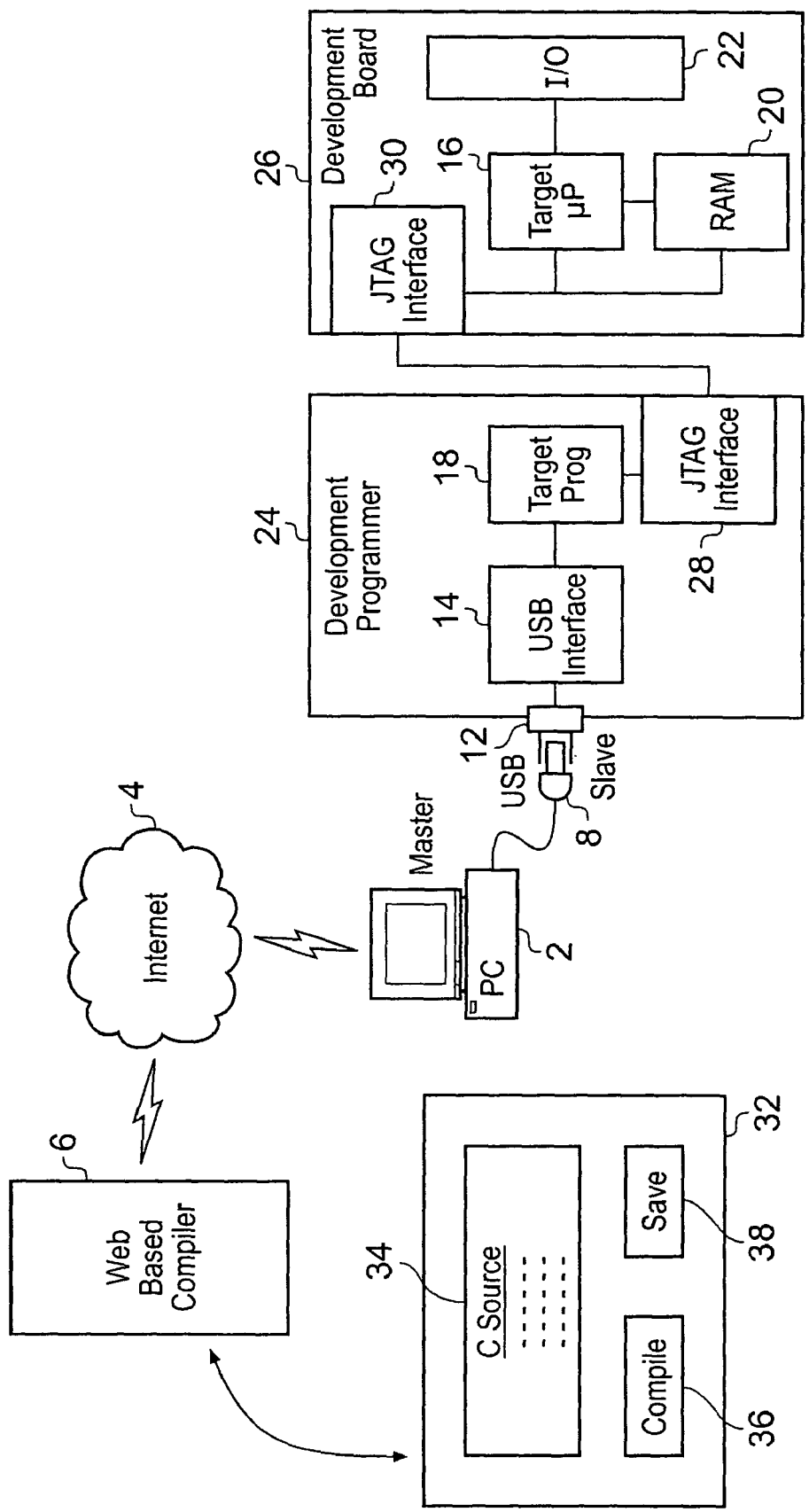
FIG. 2 schematically illustrates a second example embodiment of a system for programming a target device.

FIG. 2 illustrates a second example embodiment. In this example embodiment, it will be seen that the development board 10 of FIG. 1 has been provided as a separate development programmer 24 and a development board 26. The development programmer 24 is linked via a JTAG interface 28 driven by the target programmer 18 to the development board 26, which includes a complementary JTAG interface 30. The development board 26 can be a standard development board as these are often provided with JTAG interface mechanisms for programming such development boards.

Also illustrated in FIG. 2 is a representation of a web page 32 which is provided by the web-based compiler 6 to the personal computer 2. This web page includes a window 34 into which a user can type or paste program source code, such as C program source. When this source code has been entered, the user activates a compile button 36 which triggers the web-based compiler 6 to compile the program source code to generate a compiled program, such as an .axf file. The user can then activate a save button 38 to trigger a download dialogue whereby the compiled program can be downloaded via the internet 4 to the personal computer 2. This downloaded file can then be transferred across to the target processor 6 using the development programmer 10, 24 as an apparent mass storage device.

As an alternative in the context of providing a configuration file for an FPGA, a web-based synthesis tool may be used with a HDL description being pasted to or written on the tool and used to synthesise an FPGA configuration file to configure an FPGA to carry out the desired function(s). A file of characterising data updated from the target device or programmer can be used as an input to the synthesis tool or compiler.

It will be appreciated in the above that the development board 10 and the development programmer 20 have been described as giving the appearance of a USB mass storage device. These devices are USB slave devices. The development board 10 and the development programmer 24 could also act in a manner so as to appear as one or more additional or alternative USB end point devices, such as a USB custom device, a USB communications class device via a UART interface or a custom programmer protocol interface. The USB interface 14 in each case would additionally provide the signals back to the personal computer 2 so as to make the development board 10 or the development programmer 24 appear as such a device.

Figure 3:
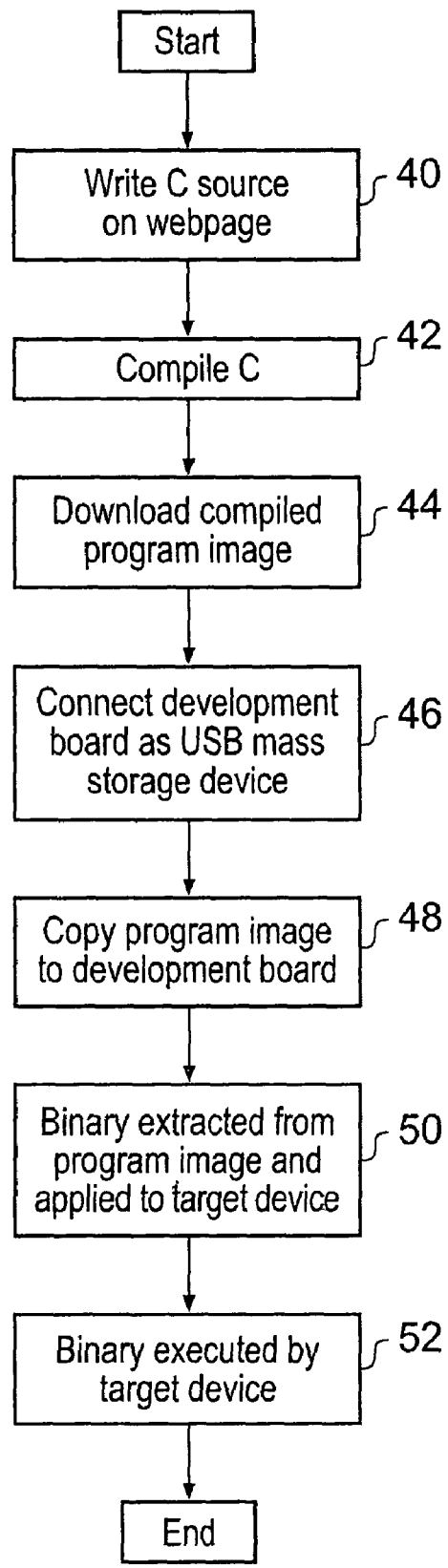
FIG. 3 is a flow diagram schematically illustrating the process of programming a target device in accordance with the systems of FIG. 1 or 2.

FIG. 3 schematically illustrates the process of programming a target device in accordance with the present techniques. At step 40 a user writes a C source program on a web page within a window 34. At step 42 this source code is compiled by activating the compile button 36. At step 44 the compiled program is downloaded to the personal computer 2 (host) by pressing a save button 38 to initiate the download. At step 46, the personal computer 2 connects to the development board 10, or the development programmer 24, as a mass storage device. It will be appreciated that whilst step 46 is shown at a particular point within the sequence of FIG. 3, it could in practice be connected at some other time, such as in advance of the whole process.

At step 48, a user of the personal computer 2 copies the program downloaded to the development board 10, or the development programmer 24, using the metaphor of the development board 10, or the development programmer 24, appearing as a mass storage device and providing a mass storage device folder into which the file can be copied (e.g. dragged and dropped). At step 50, the target programmer 18 extracts the program image from the program file and applies this to the target processor 16. At step 52 the binary is executed by the target processor 16 and the results observed, either through action of the input output circuitry 20 or by a results file, such as a log.txt file written by the target processor 16 and readable by the personal computer 2 using the mass storage device connection.

Figure 4:
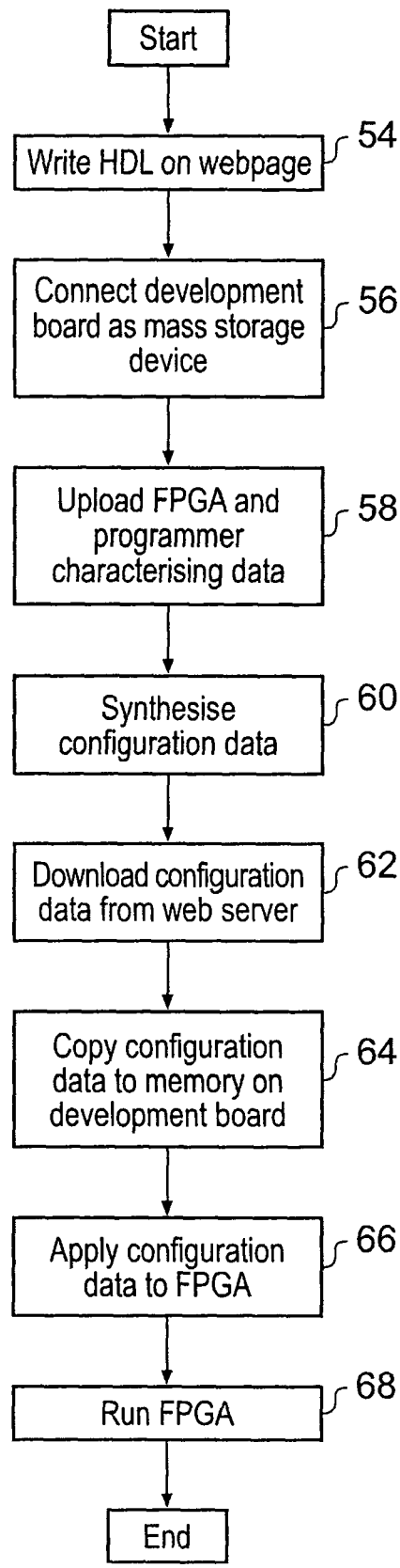
FIG. 4 is a flow diagram schematically illustrating the process of configuring an FPGA in accordance with the systems of FIGS. 1 and 2.

FIG. 4 is a flow diagram schematically illustrating the process of configuring a target device in the form of a field programmable gate array (FPGA) in accordance with the present techniques. At step 54 a high level description language definition of a device to be formed is written on a web-based synthesis tool, such as is provided by an alternative web-based server 6 communicated with via the internet 4. This HDL description can be written on the tool itself or pasted into a window on the tool having been written elsewhere. At step 56 the development board is connected to the host PC 2 and is recognised as a mass storage device using the mass storage device metaphor. At step 58 a file containing characterising data for the FPGA on the development board and of the programmer itself can be uploaded from the development board to the host PC 2 and then passed to the web-based synthesis tool as an input to the synthesis to be performed. At step 60 the HDL description and the characterising data are used as inputs to a synthesis step in which configuration data for the FPGA is generated in accordance with standard synthesis techniques. At step 62 this configuration data is downloaded from the web-server 6 to the host PC 2. At step 64 the configuration data is copied from the host PC 2 to the development board 10 using the mass storage device metaphor. At step 66 the configuration data is applied to the FPGA. This programming of the FPGA may be triggered by a file access command, such as writing a file having a particular content to a particular location or merely writing anything to a particular folder. At step 68 the FPGA device itself can then be triggered to run.

Figure 5:
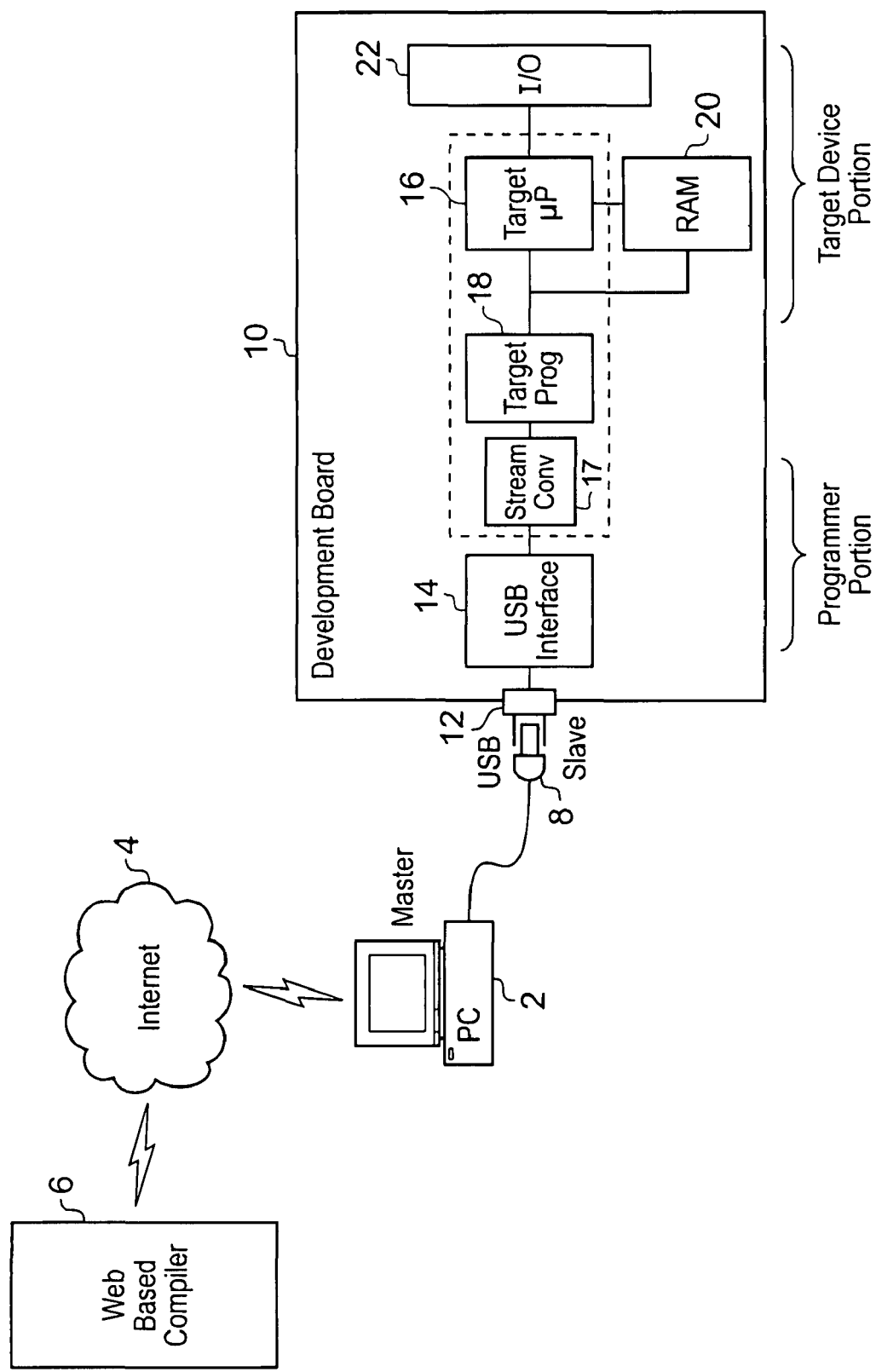
FIG. 5 schematically illustrates a third example embodiment of a system for programming a target device.

FIG. 5 schematically illustrates a third example embodiment. This is modified over the example embodiment of FIG. 1 by the addition of stream conversion circuitry 17 which serves to convert the stream of data received at the mass storage interface 14 into a stream of data for supply to the target device 16, 20 so as to program the target device 16, 20. Converting the received stream dynamically in this way avoids having to provide a large memory for storing the received file prior to extracting the image therefrom. The target programmer 18 also has the task of generating appropriate programming control signals to be applied to the target device 16, 20, e.g. signals to control the memory 20 to store the stream of image data so that this can then form at least a program to be executed by the microprocessor 16.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A programmer for programming a target device with a program from a host, wherein said host is coupled via an internet connection to a web-based compiler for compiling source code to generate said program, said programmer comprising:

a mass storage interface;

processing logic, coupled to said mass storage interface, configured to generate signals so as to appear as a mass storage device to said host such that a file containing said program from said host can be transferred to said programmer as if said programmer were said mass storage device; and a target programmer responsive to said program:
(i) to generate programming control signals applied to said target device;
(ii) to extract said program from said file; and
(iii) to apply said program to said target device under control of said programming control signals, wherein said target programmer programs said target device with said program so that said program is available for execution by said target device.

2. A programmer as claimed in claim 1, wherein said program is a configuration file, said target device is a field programmable gate array and said target programmer configures said field programmable gate array with said configuration file.

3. A programmer as claimed in claim 1, wherein said target programmer processes said program as received from said host to generate a modified form of said program to be applied to said target device.

4. A programmer claimed in claim 1, wherein said target program transforms a stream of data received at said mass storage interface and containing said program into a stream of data supplied to said target device to apply said program to said target device.

5. A programmer as claimed in claim 1, wherein said target device includes a programmable processor core separate from said processing logic and said target programmer.

6. A programmer as claimed in claim 5, wherein said target device is provided on a separate development board.

7. A programmer as claimed in claim 6, wherein said separate development board is coupled to said programmer via a JTAG interface, said target programmer driving said JTAG interface to program said target device.

8. A programmer as claimed in claim 1, wherein at least one of said processing logic and said target programmer includes a programmable processor core, said programmable processor core also serving as said target device.

9. A programmer as claimed in claim 1, wherein said host is a personal computer having a generic mass storage device driver for communicating with said programmer.

10. A programmer as claimed in claim 1, wherein said mass storage interface is a USB mass storage interface with said programmer serving as a USB slave device.

11. A programmer as claimed in claim 10, wherein said processing logic also generates signals so as to appear as one or more other USB endpoint devices.

12. A programmer as claimed in claim 11, wherein said one or more other USB endpoint devices include one or more of:
a USB custom device;
a USB communications class device; and
an endpoint compatible with a custom programmer protocol.

13. A programmer as claimed in claim 12, wherein said processing logic also generates signals so as to appear as a communications class device connecting to said target device via a UART interface.

14. A programmer as claimed in claim 1, wherein a predetermined file access operation to said programmer acting as a mass storage device serves as a control input to said programmer resulting in said programmer performing one or more predetermined operations.

15. A programmer as claimed in claim 1, wherein said processing logic is responsive to at least one of a file received from said target to provide access to said file by said host as if said file was stored within said mass storage device and a file access request received from said target to service said file access request.

16. A programmer as claimed in claim 1, wherein said programmer provides access to a file containing data characterising at least one of said programmer and said target device to said host.

17. A programmer as claimed in claim 16, wherein said file containing data characterising at least one of said programmer and said target device is uploadable to said web based compiler to provide configuration information.

18. A method of programming a target device with a program from a host, wherein said host is coupled via an internet connection to a web-based compiler for compiling source code to generate said program, said method comprising the steps of:
generating signals at a mass storage interface of a programmer so that said programmer appears as a mass storage device to said host;
saving a file containing said program from said host to said programmer as if said programmer were said mass storage device; and
in response to said program:
(i) generating programming control signals applied to said target device;
(ii) extracting said program from said file; and
(iii) applying said program to said target device under control of said programming control signals, wherein said target device is programmed with said program so that said program is available for execution by said target device.

19. A method as claimed in claim 18, wherein said program is a configuration file, said target device is a field programmable gate array and said field programmable gate array is configured with said configuration file.

20. A method as claimed in 18, wherein said program as received from said host is processed to generate a modified form of said program to be applied to said target device.

21. A method as claimed in claim 18, comprising transforming a stream of data received at said mass storage interface and containing said program into a stream of data supplied to said target device to apply said program to said target device.

22. A method as claimed in claim 18, wherein said target device includes a programmable processor core separate from logic performing said steps of generating, saving and applying.

23. A method as claimed in claim 22, wherein said target device is provided on a separate development board.

24. A method as claimed in claim 23, wherein said separate development board is coupled to said logic performing said steps of generating, saving and applying via a JTAG interface, said method further comprising the steps of driving said JTAG interface to program said target device.

25. A method as claimed in claim 18, wherein said logic performing said steps of generating, saving and applying includes a programmable processor core, said programmable processor core also serving as said target device.

26. A method as claimed in claim 18, wherein said host is a personal computer having a generic mass storage device driver for communicating with said mass storage interface.

27. A method as claimed in claim 18, wherein said mass storage interface is a USB mass storage interface serving as a USB slave device.

28. A method as claimed in claim 27, wherein said step of generating also generates signals so as to appear as one or more other USB endpoint devices.

29. A method as claimed in claim 28, wherein said one or more other USB endpoint devices include one or more of:
- a USB custom device;
- a USB communications class device; and
- an endpoint compatible with a custom programmer protocol.

30. A method as claimed in claim 29, wherein said step of generating generates signals so as to appear as a communications class device connecting to said target device via a UART interface.

31. A method as claimed in claim 18, wherein a predetermined file access operation to said mass storage device serves as a control input to resulting in one or more predetermined operations.

32. A method as claimed in claim 18, wherein at least one of access to a file received from said target by said mass storage device is provided to said host as if said file was stored within said mass storage device and a file access request received from said target device is serviced by said mass storage device.

33. A method as claimed in claim 18, wherein access is provided to a file containing data characterising at least one of said programmer and said target device to said host.

* * * * *